(12) United States Patent
Sun (10) Patent No.: US 11,880,096 B1
(45) Date of Patent: Jan. 23, 2024

(54) SPLICING DISPLAY DEVICE

(71) Applicant: TCL China Star Optoelectronics Technology Co., Ltd., Guangdong (CN)

(72) Inventor: Bo Sun, Guangdong (CN)

(73) Assignee: TCL China Star Optoelectronics Technology Co., Ltd., Shenzhen (CN)

(*) Notice: Subject to any disclaimer, the term of this patent is extended or adjusted under 35 U.S.C. 154(b) by 0 days.

(21) Appl. No.: 17/897,276

(22) Filed: Aug. 29, 2022

(51) Int. Cl.
| | |
|---|---|
| *H05K 1/11* | (2006.01) |
| *H01L 51/52* | (2006.01) |
| *G02F 1/1333* | (2006.01) |
| *G02F 1/1335* | (2006.01) |
| *G09F 9/33* | (2006.01) |
| *H01L 33/50* | (2010.01) |
| *G09F 9/302* | (2006.01) |
| *H01L 25/075* | (2006.01) |

(52) U.S. Cl.
CPC .... *G02F 1/13336* (2013.01); *G02F 1/133614* (2021.01); *G09F 9/3026* (2013.01); *G09F 9/33* (2013.01); *H01L 25/0753* (2013.01); *H01L 33/505* (2013.01)

(58) Field of Classification Search
CPC ........... G02F 1/13336; G02F 1/133614; G09F 9/3026; G09F 9/33; H01L 25/0753; H01L 33/505
See application file for complete search history.

(56) References Cited

U.S. PATENT DOCUMENTS

| | | | | |
|---|---|---|---|---|
| 2016/0266437 A1* | 9/2016 | Liu | ................... | G02F 1/133524 |
| 2016/0267860 A1* | 9/2016 | Liu | .......................... | G09G 3/32 |
| 2020/0111391 A1* | 4/2020 | Chao | ................... | H01L 25/0753 |
| 2020/0209658 A1* | 7/2020 | Xiao | ................. | G02F 1/133603 |
| 2021/0020614 A1* | 1/2021 | Yueh | ................. | G02F 1/133603 |

(Continued)

FOREIGN PATENT DOCUMENTS

| | | |
|---|---|---|
| CN | 111653207 | 9/2020 |
| CN | 113238417 | 8/2021 |

(Continued)

OTHER PUBLICATIONS

Decision of Rejection dated May 25, 2023 From the State Intellectual Property Office of the People's Republic of China Re. Application No. 202210861867.0 and Its Translation Into English. (18 Pages).

(Continued)

*Primary Examiner* — Tracie Y Green (57) ABSTRACT

A display device includes at least one second splicing screen and at least two first splicing screens. The first splicing screen includes a first substrate, a first blue light-emitting unit disposed on the first substrate, and a first yellow fluorescent layer coated on the first blue light-emitting unit. The second splicing screen includes a second substrate and a plurality of second light-emitting units disposed on the second substrate. At least a part of the plurality of second light-emitting units is second blue light-emitting units. Color-gamut adjusting units are disposed on at least a part of the second blue light-emitting units. A light-emitting spectrum of the second blue light-emitting units through the color-gamut adjusting units is consistent to a light-emitting spectrum of the first splicing screens.

9 Claims, 5 Drawing Sheets

(56) References Cited

U.S. PATENT DOCUMENTS

| | | | | |
|---|---|---|---|---|
| 2022/0013056 A1* | 1/2022 | Wang | ........................ | G09G 3/20 |
| 2022/0223573 A1* | 7/2022 | Yang | ........................ | H01L 33/52 |
| 2022/0278174 A1* | 9/2022 | Yu | ...................... | G02F 1/133617 |
| 2023/0053694 A1* | 2/2023 | Xiang | ..................... | H05K 1/112 |

FOREIGN PATENT DOCUMENTS

| | | |
|---|---|---|
| CN | 114068505 | 2/2022 |
| CN | 114299828 | 4/2022 |

OTHER PUBLICATIONS

Notification of Office Action dated Mar. 31, 2023 From the State Intellectual Property Office of the People's Republic of China Re. Application No. 202210861867.0 and Its Translation Into English. (15 Pages).

\* cited by examiner

SPLICING DISPLAY DEVICE

RELATED APPLICATION

This application claims the benefit of priority of Chinese Patent Application No. 202210861867.0 filed on Jul. 20, 2022, the contents of which are incorporated by reference as if fully set forth herein in their entirety.

BACKGROUND OF INVENTION

Field of Invention

The present application relates to the field of display technology, and specifically to a splicing display device.

Description of Prior Art

In a precondition without increasing a size of glass substrates, larger sizes need to be realized by a splicing manner. In actual manufacture and research process, due to space limitation of sealant, glass cutting tolerance, and peripheral wiring, obvious seams at splicing positions are found, which greatly affects display effect of final splicing products.

SUMMARY OF INVENTION

The present application aims at a splicing display device, which aims to solve a problem that uneven images of splicing display devices in the prior art affects display.

On a first aspect, the present application provides a splicing display device.

The splicing display device includes:
- at least two first splicing screens, wherein each of the first splicing screens includes a first substrate and a plurality of first light-emitting units, the plurality of first light-emitting units are disposed on the first substrate, and each of the plurality of first light-emitting units includes a first blue light-emitting unit and a first yellow fluorescent layer coated on the first blue light-emitting unit; and
- at least one second splicing screen, wherein each of the second splicing screen is sandwiched between two adjacent first splicing screens, the second splicing screen includes a second substrate, a plurality of second light-emitting units are disposed on the second substrate, at least a part of the second light-emitting units is second blue light-emitting units, color-gamut adjusting units are disposed on at least a part of the second blue light-emitting units, and a light-emitting spectrum of the second blue light-emitting units through the color-gamut adjusting units is consistent to a light-emitting spectrum of the first splicing screens.

In one possible embodiment, all the plurality of second light-emitting units are the second blue light-emitting units, and the color gamut adjusting units are disposed on all the plurality of second blue light-emitting units.

In one possible embodiment, the first splicing screens are liquid crystal display screens, the second splicing screen is a mini light-emitting display (MLED) screen, the color-gamut adjusting units include second fluorescent layers and a color resist layer, the second fluorescent layer is disposed on the at least a part of the second blue light-emitting units, and the color resist layer is disposed on the second fluorescent layer.

In one possible embodiment, the second fluorescent layer is a second yellow fluorescent layer, and a thickness of the second yellow fluorescent layers ranges from 100 μm to 200 μm.

In one possible embodiment, the color resist layer includes a plurality of sub-color resists of different colors, and each of the sub-color resists is disposed on corresponding one of the second blue light-emitting units.

In one possible embodiment, the plurality of sub-color resists include a red sub-color resist, a green sub-color resist, and a blue sub-color resist; and the red sub-color resist, the green sub-color resist, and the blue sub-color resist are respectively disposed corresponding to different second blue light-emitting units.

In one possible embodiment, the second splicing screen further includes a third substrate, the third substrate is disposed opposite to and spaced apart from the second substrate, the color resist layer is disposed on a side of the third substrate close to the second blue light-emitting units, and the second fluorescent layer is disposed on a side of the color resist layer close to the second blue light-emitting units.

In one possible embodiment, the second splicing screen further includes a third substrate, the third substrate is disposed opposite to and spaced apart from the second substrate, the color resist layer is disposed on a side of the third substrate close to the second blue light-emitting units, the second fluorescent layer is disposed on the second blue light-emitting units, and the second fluorescent layer does not directly contact to the color resist layer.

In one possible embodiment, the second splicing screen further includes a third substrate, the third substrate is disposed opposite to and spaced apart from the second substrate, the second splicing screen includes a plurality of the second fluorescent layers, and at least one of the second fluorescent layers is disposed on a side of the color resist layer close to the second blue light-emitting units; and
- at least one of the second fluorescent layers is disposed on the second blue light-emitting units, and the second fluorescent layers disposed on the third substrate do not directly contact to the second fluorescent layers disposed on the second blue light-emitting units.

In one possible embodiment, the first splicing screen further includes an array substrate, a color filter substrate, and a liquid crystal layer disposed between the array substrate and the color filter substrate; the array substrate is disposed on the plurality of first light-emitting units, the color filter substrate includes a fourth substrate and color resist units disposed on a side of the fourth substrate close to the array substrate, and an interval between the sub-color resists disposed on the third substrate is equal to an interval between the color resist units disposed on the fourth substrate.

The present application provides a splicing display device. The display device includes a second splicing screen and at least two first splicing screens of a same type. The first splicing screen includes a first substrate, a first blue light-emitting unit disposed on the first substrate, and a first yellow fluorescent layer coated on the first blue light-emitting unit. The second splicing screen includes a second substrate and a plurality of second light-emitting units disposed on the second substrate. At least a part of the plurality of second light-emitting units is second blue light-emitting units, and color-gamut adjusting units are disposed on at least a part of the second blue light-emitting units. A light-emitting spectrum of the second blue light-emitting units through the color-gamut adjusting units is consistent to a light-emitting spectrum of the first splicing screens. In the present application, by disposing the color-gamut adjusting units, the light-emitting spectrum of the second splicing screen located at a seam is consistent to a light-emitting spectrum of the first splicing screens. Therefore, a color gamut of light of the second splicing screen is reduced, thereby preventing an abnormal image problem incurred by large difference in color gamut, and improving the image display effect at the seam.

DESCRIPTION OF DRAWINGS

To more clearly illustrate the technical solutions of the embodiments of the present application, the accompanying figures of the present application will be described in brief. Obviously, the accompanying figures described below are only part of the embodiments of the present application, from which figures those skilled in the art can derive further figures without making any inventive efforts.

DETAILED DESCRIPTION OF EMBODIMENTS

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application.

In the description of the present application, it should be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", etc is based on the orientation or positional relationship shown in the accompanying figures, which is merely for the convenience for describing of the present application and for the simplification of the description, and is not intended to indicate or imply that the indicated devices or elements have a specific orientation or is constructed and operated in a specific orientation. Therefore, it should not be understood as a limitation on the present application. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present application, the meaning of "a plurality" is two or more unless clearly and specifically defined otherwise.

In the present application, the term "exemplary" is used to mean "serving as an example, instance, or illustration." Any embodiment described in the present application as "exemplary" is not necessarily to be interpreted as preferred or advantageous over other embodiments. The following description is presented for enable any person skilled in the art to make and use the present application. In the following description, details are listed for the purpose of explanation. It should be understood that one skilled in the art will recognize that the present application can be practiced without the specific details. In other embodiments, well-known structures and procedures are not described in detail to avoid unnecessary details making the description of the present application to become opacity. Therefore, the present application is not intended to be limited to the embodiments shown, but is in accordance with the broad scope of the principles and characteristics disclosed by present application.

Embodiments of the present application provide a splicing display device, and detailed descriptions are respectively provided below.

Figure 1:
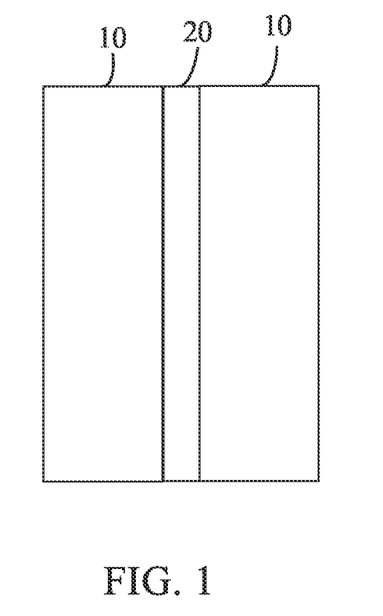
FIG. 1 is a structural schematic diagram of one embodiment of a splicing display device provided by embodiments of the present application.

Illustrated in FIG. 1 is a structural schematic diagram of one embodiment of a splicing display device provided by embodiments of the present application. Wherein, the display device can include at least two first splicing screens 10 and a second splicing screen 20.

Wherein, each of the first splicing screens 10 in the at least two the first splicing screens 10 includes a first substrate and a plurality of first light-emitting units. The plurality of first light-emitting units are disposed on the first substrate. Each of the first light-emitting units includes a first blue light-emitting unit and a first yellow fluorescent layer coated on the first blue light-emitting unit. The first blue light-emitting unit emits light to excite the first yellow fluorescent layer, so that a light emitted from the first yellow fluorescent layer is white light.

Figure 2:
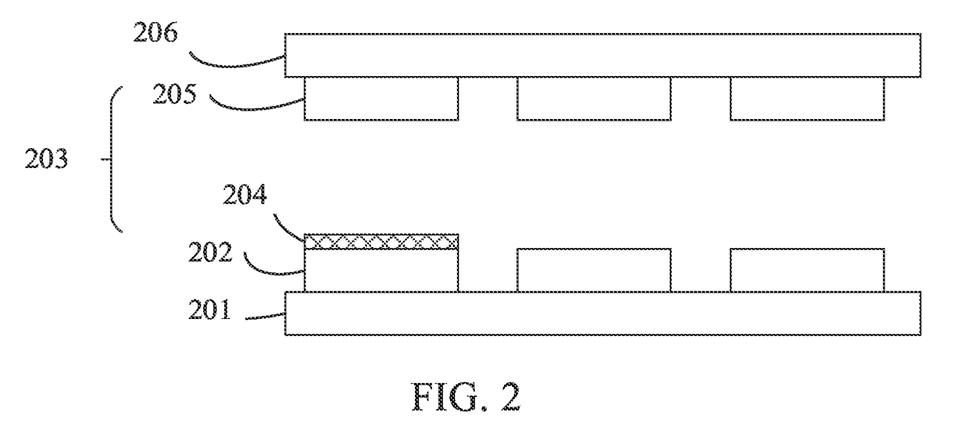
FIG. 2 is a structural schematic diagram of one embodiment of a second splicing screen provided by the embodiments of the present application.

Illustrated in FIG. 2 is a structural schematic diagram of one embodiment of a second splicing screen provided by the embodiments of the present application. In one embodiment of the present application, the second splicing screen 20 is sandwiched between two adjacent first splicing screens of a same type to fill a seam between the at least two first splicing screens, so as to prevent phenomena such as dislocation images, etc., from appearing and affecting display.

Furthermore, the second splicing screen 20 provided by one embodiment of the present application can include a second substrate 201. A plurality of second light-emitting units 202 are disposed on the second substrate 201, and at least a part of the plurality of second light-emitting units 202 is second blue light-emitting units. A color-gamut adjusting unit 203 is correspondingly disposed on at least a part of the second light-emitting units 202 that are second blue light-emitting units. At this time, after the light emitted from the second blue light-emitting unit passes through the color-gamut adjusting unit 203, a light-emitting spectrum of the light is consistent with a light-emitting spectrum of a light of the first splicing screen 10, so as to prevent abnormal images caused by different light color gamuts at seams.

The splicing display device provided by one embodiment of the present application includes at least two first splicing screens and a second splicing screen sandwiched between the at least two first splicing screens. The first splicing screen includes a plurality of first blue light-emitting units and first yellow fluorescent layers coated on the first blue light-emitting units. Furthermore, the second splicing screen includes a part of the second blue light-emitting units, and a color-gamut adjusting unit correspondingly disposed on the part of the second blue light-emitting units. A light-emitting spectrum after light emitted from the second blue light-emitting units passing through the color-gamut adjusting units is consistent to a light-emitting spectrum of the first splicing screens. Therefore, the problem that the abnormal images incurred by the different light color gamuts at the seam affect the display is prevented.

In the embodiment illustrated in FIG. 2, the color gamut adjusting unit 203 can include a second fluorescent layers 204 coated on the second blue light-emitting unit, and a color resist layer 205 disposed on the second fluorescent layers 204. In one specific embodiment, the first splicing screen 10 can be a liquid crystal display screen, and the liquid crystal display screen also includes the color resist layer disposed on the first yellow fluorescent layer. Furthermore, the second splicing layer can be a mini light-emitting display (mini-LED, MLED) screen, and the second splicing layer 20 also includes the part of the second blue light-emitting units, the second fluorescent layers 204 coated on the second blue light-emitting unit, and the color resist layer 205 disposed on the second fluorescent layers 204. At this time, light-emitting structures of the first splicing screen 10 and the second splicing screen 20 are similar. Therefore, the spectrum of the light emitted from the first splicing screen 10 is consistent with the spectrum of the light emitted from the second splicing screen 20, which reduces a color gamut of the second splicing screen 20 located at the seam, and prevents the problem of abnormal display incurred by the difference between the images of the second splicing screen 20 and the images of the first splicing screen 10 due to different color gamuts.

In the embodiment illustrated in FIG. 2, the second splicing screen 20 further includes a third substrate 206, and the third substrate 206 is disposed opposite to and spaced apart from the second substrate 201. In the embodiment illustrated in FIG. 2, only at least a part of the second light-emitting units 202 in the plurality of second light-emitting units 202 is the second blue light-emitting units, and the color-gamut adjusting units 203 are disposed on the part of the second blue light-emitting units. Furthermore, the second fluorescent layers 204 in the color-gamut adjusting units 203 are coated on the second blue light-emitting units, the color resist layer 205 is disposed on a side of the third substrate 206 close to the second blue light-emitting units, and the second fluorescent layers 204 do not directly contact to the color resist layer 205.

In an actual splicing screen, the color resist layer 205 generally includes a plurality of sub-color resists of different colors, and each of the sub-color resists is disposed on corresponding one of the second blue light-emitting units. That is, in one embodiment of the present application, corresponding sub-color resists are disposed on the second blue light-emitting units, and the plurality of second blue light-emitting units respectively corresponding to the sub-color resists of different colors form the color resist layer 205 in the second splicing screen 20.

Figure 3:
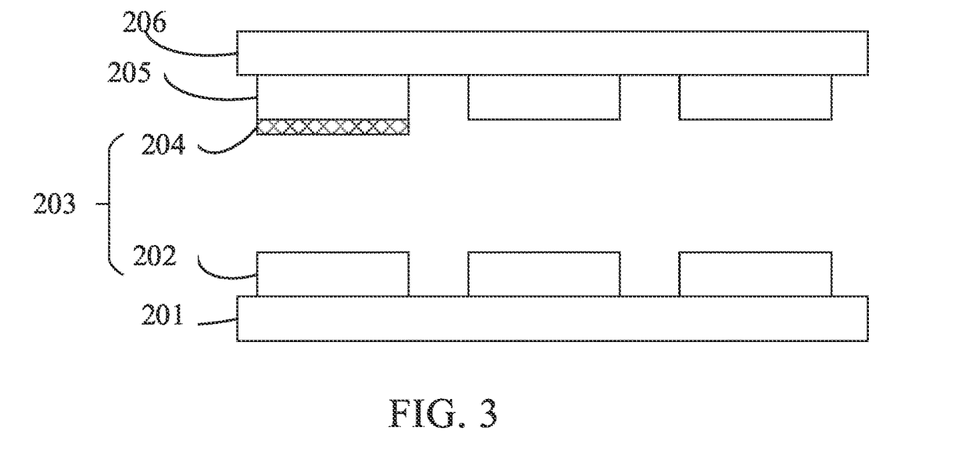
FIG. 3 is a structural schematic diagram of another embodiment of the second splicing screen provided by the embodiments of the present application.

Illustrated in FIG. 3 is a structural schematic diagram of another embodiment of the second splicing screen provided by the embodiments of the present application. In FIG. 3, the second splicing screen also includes the third substrate 206, and the second splicing screen also includes the plurality of second light-emitting unit 205 and the color-gamut adjusting unit 203. Specifically, in the embodiment illustrated in FIG. 3, a part of the second light-emitting units 202 in the plurality of second light-emitting units 202 is the second blue light-emitting units, and the sub-color resist is disposed on a side of the third substrate 206 close to the second blue light-emitting units. However, the difference from FIG. 2 is that the second fluorescent layer 204 is not directly coated on the second blue light-emitting unit but is coated on a side of the sub-color resist close to the blue light-emitting units, i.e., the second fluorescent layer 204 directly contacts to the sub-color resists.

No matter in the embodiment illustrated in FIG. 2 or in the embodiment illustrated in FIG. 3, the light emitted by the second blue light-emitting unit sequentially passes through the second fluorescent layer 204 and the color resist layer 205 and then emits. Therefore, whether the second fluorescent layer 204 is coated on the second blue light-emitting unit or is coated on the color resist layer 205, a trend of the light is not affected, and emission principle of the light is not affected either. The embodiments illustrated in FIG. 2 or FIG. 3 can both realize effect of reducing the color gamut of the light of the second splicing screen 20.

It should be noted that, in one embodiment of the present application, the plurality of second light-emitting units 202 are generally independent to each other. Therefore, the plurality of second blue light-emitting units are also independent to each other, and the color-gamut adjusting units disposed on the second blue light-emitting units are also independent to each other. Furthermore, because different second blue light-emitting units all correspond to the second fluorescent layers and the sub-color resist, the second fluorescent layers 204 on the different second blue light-emitting units are also independent. That is, in this embodiment of the present application, the second fluorescent layers 204 corresponding to different second blue light emitting units is configured to act as an independent film layer. Furthermore, when the second splicing screen includes the plurality of color-gamut adjusting units 203, the plurality of second fluorescent layers 204 are also included actually.

Figure 4A:
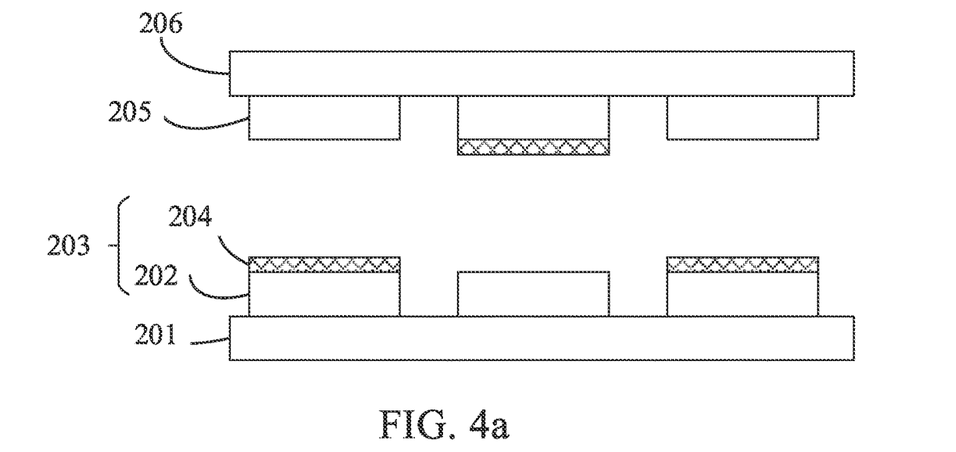
FIG. 4*a* is a structural schematic diagram of another embodiment of the second splicing screen provided by the embodiments of the present application.

Illustrated in FIG. 4a is a structural schematic diagram of another embodiment of the second splicing screen provided by the embodiments of the present application. In FIG. 4a, at this time, the plurality of second light-emitting units 202 in the second splicing screen are second blue light-emitting units, and each of the second blue light-emitting units corresponds to one color-gamut adjusting unit 203, i.e., there are a plurality of color-gamut adjusting units 203. The plurality of color-gamut adjusting units 203 correspond to a plurality of second fluorescent layers 204. Furthermore, the plurality of second fluorescent layers 204 can be partially disposed on the second blue light-emitting units, and another part of the plurality of second fluorescent layers 204 is disposed on the color resist layer 205. That is, in the embodiment illustrated in FIG. 4a, positions of the plurality of second fluorescent layers 204 are not fixed. A part of the second fluorescent layers 204 can be disposed on the second blue light-emitting units, and another part of the second fluorescent layers 204 can also be disposed on the color resist layer 205. According to the contents of the aforesaid embodiments, the position of the second phosphor layer 204 does not affect the final entire light-emitting structure. The second blue light-emitting units and the color gamut adjusting unit are also used in the second splicing screen 20 to adjust the color gamut.

Figure 4B:
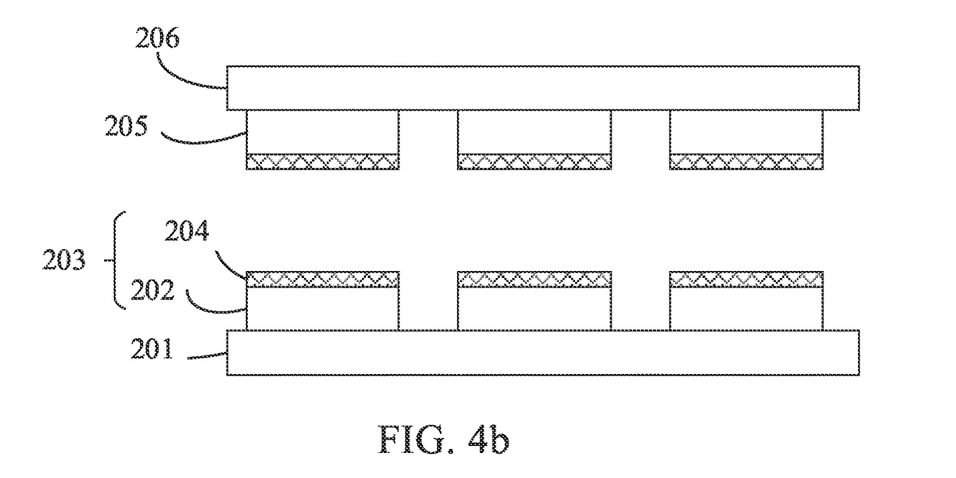
FIG. 4*b* is a structural schematic diagram of another embodiment of the second splicing screen provided by the embodiments of the present application.

Illustrated in FIG. 4b is a structural schematic diagram of another embodiment of the second splicing screen provided by the embodiments of the present application. In the embodiment illustrated in FIG. 4b, the plurality of second light-emitting units 202 are all second blue light-emitting units, and there are a plurality of second fluorescent layers 204. At this time, the second fluorescent layers 204 can be coated on the plurality of second blue light-emitting units, so that each of the second blue light-emitting unit has the second fluorescent layer 204 directly contacted to the second blue light-emitting unit. Meanwhile, the second fluorescent layers 204 are also coated on the side on the color resist layer 205 close to the second blue light-emitting unit. That is, the second fluorescent layers 204 are disposed on all the second blue light-emitting units 204, and the second fluorescent layers 204 are also disposed on the side on the color resist layer 205 close to the second blue light-emitting unit. Furthermore, in the embodiment illustrated in FIG. 4a, when the second fluorescent layers 204 are disposed on the second blue light-emitting units, the second fluorescent layer 204 is not disposed on the sub-color resist corresponding to the second fluorescent layers 204.

In the aforesaid embodiments, the first splicing screen 10 can further include an array substrate, a color filter substrate, and a liquid crystal layer disposed between the array substrate and the color filter substrate. Furthermore, the array substrate is disposed on the plurality of first light-emitting units, and the color filter substrate includes a fourth substrate and color resist units disposed on a side of the fourth substrate close to the array substrate. In the embodiments of the present application, the second fluorescent layer 204 is generally a yellow fluorescent layer. At this time, the structure of the second splicing screen 20 is: second blue light-emitting unit+second yellow fluorescent layer+color resist layer, and the structure of the first splicing screen 10 is also: first blue light-emitting unit+first yellow fluorescent layer+color resist layer. At this time, the entire light-emitting structure in the first splicing screen 10 is similar to the entire light-emitting structure in the second splicing screen 20, so that the spectrum of the light emitted by the first splicing screen 10 is consistent with the spectrum of the light emitted by the second splicing screen 20, thereby solving the problem of abnormal images at seams incurred by different color gamuts of lights.

In the aforesaid embodiment, an interval between color resist units disposed on the fourth substrate in the first splicing screen 10 is equal to an interval between the sub-color resists units disposed on the third substrate in the second splicing screen 20.

Specifically, the color resist units disposed on the fourth substrate generally includes a red sub-color resist, a green sub-color resist, and a blue sub-color resist. The interval between the color resist units specifically refers to an interval between two adjacent sub-color resist units along a row direction or a column direction. The interval between the sub-color resists disposed on the third substrate specifically refers to an interval between two adjacent sub-color resists along the row direction or the column direction.

In this embodiment, the interval between two adjacent two sub-color resist units located in the first splicing screen 10 can be configured to be equal to the interval between two adjacent sub-color resist units located in the second splicing screen 20 in the row direction. The interval between two adjacent two sub-color resist units located in the first splicing screen 10 can be configured to be equal to the interval between two adjacent sub-color resist units located in the second splicing screen 20 in the column direction. Therefore, a size of pixel units in the first splicing screen 10 can be made consistent with a size of pixel units in the second splicing screen 20, so that optical performance of the first splicing screen 10 and the second splicing screen 20 are more consistent.

Furthermore, manufacturing the color resist units in the first splicing screen 10 and manufacturing the sub-color resists in the second splicing screen 20 can be performed simultaneously, so no additional manufacturing process is required.

Furthermore, in one embodiment of the present application, when the color resist layer 205 includes a plurality of sub-color resists, the plurality of sub-color resists can include a red sub-color resist, a green sub-color resist, and a blue sub-color resist. The red sub-color resist, the green sub-color resist, and the blue sub-color resist are respectively disposed corresponding to different second blue light-emitting units. When the second fluorescent layers 204 are coated on the side of the color resist layer 205 close to the second blue light-emitting units, the second fluorescent layers 204 are actually coated on a side of the plurality of sub-color resists of different colors close to the second blue light-emitting units.

In the embodiments of the present application, a thickness of the second yellow fluorescent layers generally ranges from 100 µm to 200 µm, an thicknesses of the second fluorescent layers 204 in different color-gamut adjusting units are generally equal. Of course, in other embodiments, a thickness and a type of yellow fluorescent powder used for manufacturing the second yellow fluorescent layer can be adjusted according to brightness of actual white light or requirements of color temperature, which are not specifically limited herein.

In aforesaid embodiments, the part of the second light-emitting units in the plurality of second light-emitting units being second blue light-emitting units is described. In other embodiment, in the plurality of second light-emitting units, all the plurality of the second light-emitting units can also be second blue light-emitting units.

Figure 5:
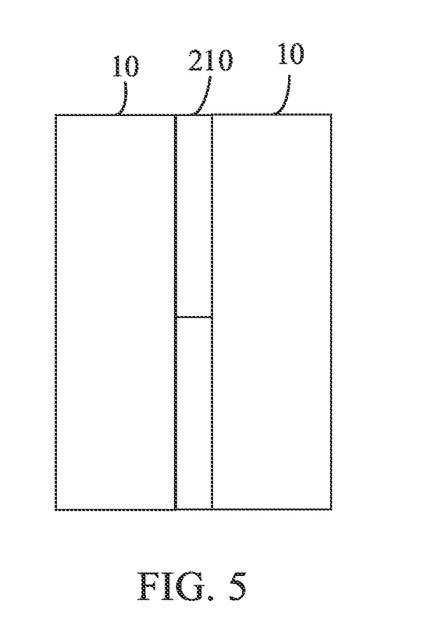
FIG. 5 is a structural schematic diagram of another embodiment of the splicing display device provided by the embodiments of the present application.

Regarding the splicing display device provided by one embodiment of the present application, more splicing screens can be included. Specifically, illustrated in FIG. 5 is a structural schematic diagram of another embodiment of the splicing display device provided by the embodiments of the present application. In FIG. 5, the second splicing screen 20 can include a plurality of second sub-splicing screens 210, and the plurality of second sub-splicing screens 210 are splicing screens of a same type. The plurality of second splicing screens 20 are sandwiched between two first splicing screens 10.

Specifically, the second splicing screen can include two second sub-splicing screens 210 of a same type. As illustrated in FIG. 5, two second sub-splicing screens 210 are arranged in an array manner, and the two second sub-splicing screens 210 arranged in the array manner are also sandwiched between two first splicing screens 10.

In other embodiments, the second splicing screen 20 can also include three, four, or more second sub-splicing screens 210, which can also be arranged in the manner illustrated in FIG. 5, and redundant description will not be mentioned herein again.

Figure 6:
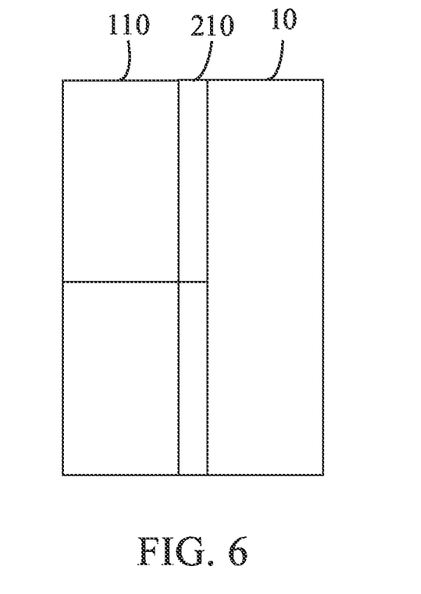
FIG. 6 is a structural schematic diagram of another embodiment of the splicing display device provided by the embodiments of the present application.

Illustrated in FIG. 6 is a structural schematic diagram of another embodiment of the splicing display device provided by the embodiments of the present application. In FIG. 6, any one of the first splicing screens 10 in the at least two the first splicing screens 10 can include a plurality of first sub-splicing screens 110. The plurality of first sub-splicing screens 110 are splicing screens of a same type. The plurality of first sub-splicing screens 110 are disposed corresponding to the plurality of second sub-splicing screens 210 one to one. At this time, the plurality of second sub-splicing screens 210 are sandwiched between the plurality of first sub-splicing screens 110 and one complete first splicing screen 10.

Figure 7:
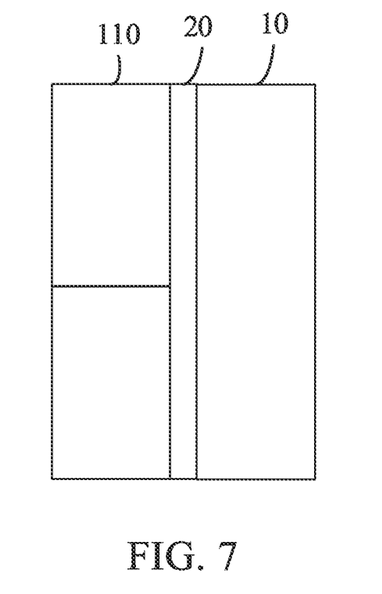
FIG. 7 is a structural schematic diagram of another embodiment of the splicing display device provided by the embodiments of the present application.

Illustrated in FIG. 7 is a structural schematic diagram of another embodiment of the splicing display device provided by the embodiments of the present application. In FIG. 7, the first splicing screen 10 includes a plurality of first sub-splicing screens 110. The plurality of first sub-splicing screens 110 are splicing screens of a same type. The plurality of first sub-splicing screens 110 are arranged in an array manner, so as to make the second splicing screens 20 be sandwiched between the plurality of first sub-splicing screens 110 and one complete first splicing screen 10.

Figure 8:
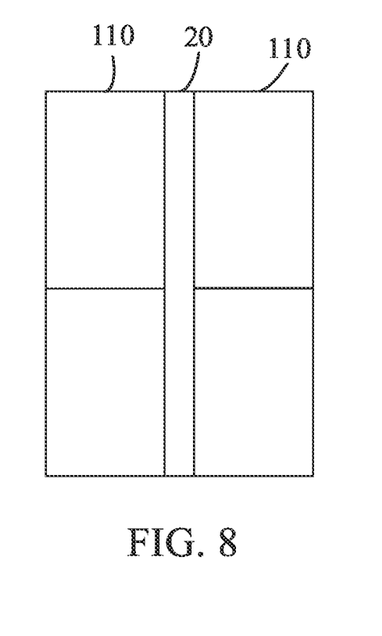
FIG. 8 is a structural schematic diagram of another embodiment of the splicing display device provided by the embodiments of the present application.

Illustrated in FIG. 8 is a structural schematic diagram of another embodiment of the splicing display device provided by the embodiments of the present application. In FIG. 8, at least two first splicing screen 10 both include a plurality of first sub-splicing screens 110. The plurality of first sub-splicing screens 110 are splicing screens of a same type. The plurality of first sub-splicing screens 110 in different first splicing screens 10 are arranged in an array manner, so as to make the second splicing screens 20 be sandwiched between the plurality of first sub-splicing screens 110 and the plurality of first sub-splicing screens 110.

Figure 9:
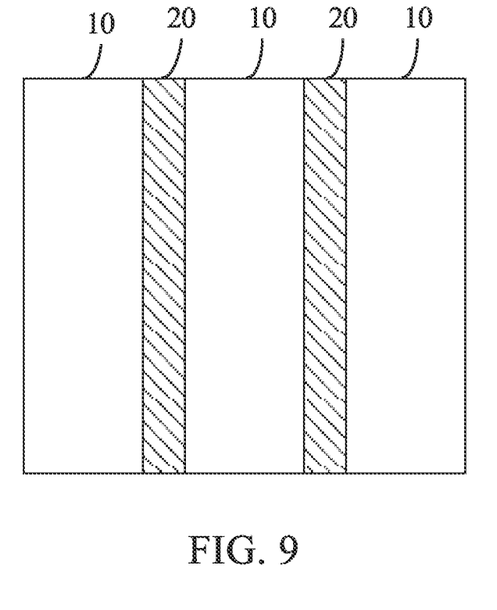
FIG. 9 is a structural schematic diagram of another embodiment of the splicing display device provided by the embodiments of the present application.

In some embodiments of the present application, the display device can further include more first splicing screens and more second splicing screens. Illustrated in FIG. 9 is a structural schematic diagram of another embodiment of the splicing display device provided by the embodiments of the present application. In FIG. 9, the display device includes three first splicing screens 10 and two second splicing screens 20, and the two second splicing screen 20 are respectively sandwiched between two adjacent first splicing screens 10. In one specific embodiment, the first splicing screen 10 can be a liquid crystal display (LCD), and the second splicing screen 20 can be a mini light-emitting diode (MLED) display. At this, two MLEDs are respectively sandwiched between two LCDs.

Figure 10:
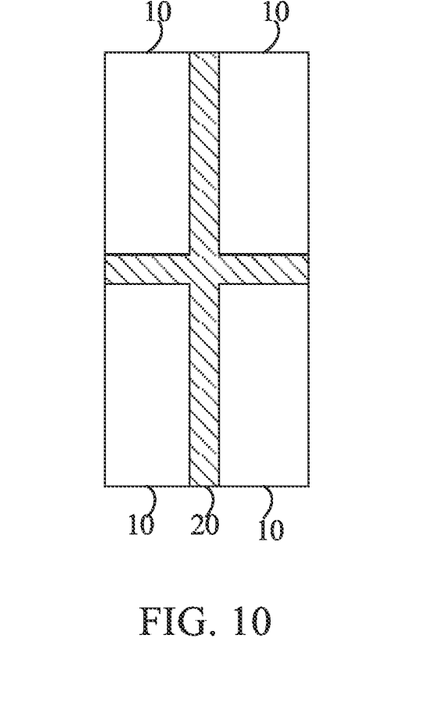
FIG. 10 is a structural schematic diagram of another embodiment of the splicing display device provided by the embodiments of the present application.

Illustrated in FIG. 10 is a structural schematic diagram of another embodiment of the splicing display device provided by the embodiments of the present application. In FIG. 10, the display device can further include four first splicing screens 10 and one second splicing screen 20. However, in the embodiment illustrated in FIG. 10, the second splicing screen is a cross-shaped structure but is not a conventional rectangular structure. In FIG. 10, the four first splicing screen 10 are respectively disposed in four directions of the second splicing screen 20 of the cross-shaped structure.

In the embodiments mentioned above, the descriptions to the various embodiments are emphasized, and the part is not described in detailed in an embodiment, can refer to the detailed description of other embodiments mentioned above, and will not give unnecessary details herein.

During a specific implementation, the various units or structures mentioned above may be implemented as a separate entity, or may be implemented in any combination, as the same or several entities. For the specific implementation of the various units or structures mentioned above, can refer to the method embodiments mentioned above, and will not give unnecessary details herein.

For the specific implementation of each operation can refer to the embodiments mentioned above, and will not give unnecessary details herein.

The above describes the splicing display device of the embodiments of the present application in detail. This article uses specific cases for describing the principles and the embodiments of the present application, and the description of the embodiments mentioned above is only for helping to understand the method and the core idea of the present application. Meanwhile, for those skilled in the art, will have various changes in specific embodiments and application scopes according to the idea of the present application. In summary, the content of the specification should not be understood as limit to the present application.

What is claimed is:

1. A splicing display device, comprising:
   at least two first splicing screens, wherein each of the at least two first splicing screens comprises a first substrate and a plurality of first light-emitting units, the plurality of first light-emitting units are disposed on the first substrate, and each of the plurality of first light-emitting units comprises a first blue light-emitting unit and a first yellow fluorescent layer coated on the first blue light-emitting unit; and
   at least one second splicing screen, wherein each of the at least one second splicing screen is sandwiched between adjacent two of the at least two first splicing screens, the at least one second splicing screen comprises a second substrate, a plurality of second light-emitting units are disposed on the second substrate, at least a part of the plurality of second light-emitting units is second blue light-emitting units, color-gamut adjusting units are disposed on at least a part of the second blue light-emitting units, and a light-emitting spectrum of the second blue light-emitting units through the color-gamut adjusting units is consistent to a light-emitting spectrum of the at least two first splicing screens,
   wherein the at least two first splicing screens are liquid crystal display screens, the at least one second splicing screen is a mini light-emitting display (MLED) screen, the color-gamut adjusting units comprise a second fluorescent layer and a color resist layer, the second fluorescent layer is disposed on the at least a part of the second blue light-emitting units, and the color resist layer is disposed on the second fluorescent layer.

2. The splicing display device as claimed in claim 1, wherein all the plurality of second light-emitting units are the second blue light-emitting units, and the color gamut adjusting units are disposed on all the second blue light-emitting units.

3. The splicing display device as claimed in claim 1, wherein the second fluorescent layer is a second yellow fluorescent layer, and
   a thickness of the second yellow fluorescent layers ranges from 100 μm to 200 μm.

4. The splicing display device as claimed in claim 1, wherein the color resist layer comprises a plurality of sub-color resists of different colors, and each of the sub-color resists is disposed on corresponding one of the second blue light-emitting units.

5. The splicing display device as claimed in claim 4, wherein the plurality of sub-color resists comprise a red sub-color resist, a green sub-color resist, and a blue sub-color resist; and the red sub-color resist, the green sub-color resist, and the blue sub-color resist are respectively disposed corresponding to different second blue light-emitting units.

6. The splicing display device as claimed in claim 4, wherein the at least one second splicing screen comprises a third substrate, the third substrate is disposed opposite to and spaced apart from the second substrate, the color resist layer is disposed on a side of the third substrate close to the second blue light-emitting units, and the second fluorescent layer is disposed on a side of the color resist layer close to the second blue light-emitting units.

7. The splicing display device as claimed in claim 4, wherein the at least one second splicing screen comprises a third substrate, the third substrate is disposed opposite to and spaced apart from the second substrate, the color resist layer is disposed on a side of the third substrate close to the second blue light-emitting units, the second fluorescent layer is disposed on the second blue light-emitting units, and the second fluorescent layer does not directly contact to the color resist layer.

8. The splicing display device as claimed in claim 4, wherein the at least one second splicing screen comprises a third substrate, the third substrate is disposed opposite to and spaced apart from the second substrate, the at least one second splicing screen comprises a plurality of second fluorescent layers, and at least one of the plurality of second fluorescent layers is disposed on a side of the color resist layer close to the second blue light-emitting units; and
   at least one of the plurality of second fluorescent layers is disposed on the second blue light-emitting units, and the plurality of second fluorescent layers disposed on the third substrate do not directly contact to the plurality of second fluorescent layers disposed on the second blue light-emitting units.

9. The splicing display device as claimed in claim 6, wherein the at least two first splicing screens comprise an array substrate, a color filter substrate, and a liquid crystal layer disposed between the array substrate and the color filter substrate; the array substrate is disposed on the plurality of first light-emitting units, the color filter substrate comprises a fourth substrate and color resist units disposed on a side of the fourth substrate close to the array substrate, and an interval between the sub-color resists disposed on the third substrate is equal to an interval between the color resist units disposed on the fourth substrate.

\* \* \* \* \*